United States Patent
Jung et al.

(10) Patent No.: US 6,864,177 B2
(45) Date of Patent: Mar. 8, 2005

(54) METHOD FOR MANUFACTURING METAL LINE CONTACT PLUG OF SEMICONDUCTOR DEVICE

(75) Inventors: Jong Goo Jung, Kyoungk-do (KR); Ki Cheol Ahn, Kyoungk-do (KR); Pan Ki Kwon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/329,938

(22) Filed: Dec. 26, 2002

(65) Prior Publication Data

US 2003/0119324 A1 Jun. 26, 2003

(30) Foreign Application Priority Data

Dec. 26, 2001 (KR) .......................... 2001-84904

(51) Int. Cl.[7] .................. H01L 21/461; H01L 21/302
(52) U.S. Cl. .................... 438/692; 438/694; 438/750; 438/754
(58) Field of Search ................. 438/692, 750, 438/754, 749, 756, 694, 7, 8, 10, 11, 16, 17, 455, 627

(56) References Cited

U.S. PATENT DOCUMENTS

| | | | | |
|---|---|---|---|---|
| 5,244,534 A | | 9/1993 | Yu et al. | |
| 5,674,787 A | * | 10/1997 | Zhao et al. | 438/627 |
| 5,676,587 A | * | 10/1997 | Landers et al. | 451/57 |
| 5,954,997 A | * | 9/1999 | Kaufman et al. | 252/79.1 |
| 6,046,099 A | * | 4/2000 | Cadien et al. | 438/622 |
| 6,235,633 B1 | * | 5/2001 | Jang | 438/675 |
| 6,261,158 B1 | * | 7/2001 | Holland et al. | 451/63 |
| 6,274,478 B1 | * | 8/2001 | Farkas et al. | 438/626 |
| 6,358,832 B1 | * | 3/2002 | Edelstein et al. | 438/612 |
| 6,375,552 B1 | * | 4/2002 | Cadien et al. | 451/41 |
| 6,436,829 B1 | | 8/2002 | Layadi et al. | |
| 6,439,972 B2 | * | 8/2002 | Misra et al. | 451/41 |
| 6,440,857 B1 | | 8/2002 | Li et al. | |
| 6,444,139 B1 | * | 9/2002 | Minamihaba et al. | 216/89 |
| 6,492,260 B1 | * | 12/2002 | Kim et al. | 438/631 |
| 6,520,840 B1 | * | 2/2003 | Wang et al. | 451/41 |
| 6,544,892 B2 | * | 4/2003 | Srinivasan et al. | 438/692 |
| 6,562,711 B1 | * | 5/2003 | Powers | 438/622 |
| 6,573,173 B2 | * | 6/2003 | Farkas et al. | 438/633 |
| 6,593,239 B2 | * | 7/2003 | Kaufman et al. | 438/692 |
| 6,596,640 B1 | * | 7/2003 | Fishcer et al. | 438/692 |
| 6,620,037 B2 | * | 9/2003 | Kaufman et al. | 451/559 |
| 6,635,186 B1 | * | 10/2003 | Small et al. | 216/88 |

OTHER PUBLICATIONS

Korean Intellectual Property Office Notice of Rejection dated Oct. 27, 2003.

* cited by examiner

Primary Examiner—Michael S. Lebentritt
(74) Attorney, Agent, or Firm—Marshall, Gerstein & Borun LLP

(57) ABSTRACT

A method for manufacturing of a metal line contact plug of a semiconductor device by performing a two step CMP process using (1) a first slurry solution having high etching selectivity of metal/insulating film and (2) a second slurry solution having small etching selectivity of metal/insulating film, thereby minimizing dependency on CMP devices and separating easily a metal line contact plug.

20 Claims, 5 Drawing Sheets

METHOD FOR MANUFACTURING METAL LINE CONTACT PLUG OF SEMICONDUCTOR DEVICE

BACKGROUND

1. Technical Field

A method for forming a metal line contact plug of a semiconductor device is disclosed, and more particularly, the disclosed method includes performing Chemical Mechanical Polishing (hereinafter, referred to as 'CMP') processes using (1) a first slurry solution having a high etching selectivity of metal/insulating film and (2) a second slurry solution having a low etching selectivity of metal/insulating film, thereby easily separating a metal line contact plug.

2. Description of the Related Art

Recently, device integration increases as improved integrated circuits are developed. For example, a device can comprise about 8,000,000 transistors per $cm^2$. As a result, metal lines of high quality which enable devices to be connected are required for high integration. Such multi-layered lines can be embodied by efficiently planarizing dielectrics inserted between metal lines.

As a result, since a precise process of planarizing a wafer is required, CMP processes have been developed. During a CMP process, materials which need to be removed are chemically eliminated by using chemical materials which have good reactivity in CMP slurries. Simultaneously, the wafer surface is polished mechanically with ultrafine abrasives. A CMP process is performed by injecting a liquid slurry between the top surface of a wafer and a rotating elastic pad.

In addition, a noble line technique should be required for the multi-layered lines by using a metal CMP technique. A slurry used in the metal CMP process includes oxidizers for forming oxide films on the surface of metal and abrasives. When a metal is removed by a CMP process using the slurry, the metal surface is oxidized by oxidizers, and then the oxidized portion is mechanically polished and repeatedly removed by abrasives contained in the slurry.

Hereinafter, the conventional method for manufacturing a metal line contact plug of a semiconductor device will be explained with reference to the accompanying drawings.

FIG. 1a is a top plan view after forming a bit line pattern. FIG. 1b is a top plan view after etching a metal line contact plug. FIGS. 2a through 2d illustrate schematically conventional methods for manufacturing metal line contact plugs of semiconductor devices.

FIG. 2a is a diagram illustrating a condition wherein an interlayer insulating film is stacked on an A–A' cross section of FIG. 1a. Bit lines 13 with mask insulating films 15 stacked thereon are formed on a semiconductor substrate 11. Here, the mask insulating films 15 are composed of nitride films with a thickness t1. Next, an interlayer insulating film 17 is formed on top surface of the resultant structure. The interlayer insulating film 17 is composed of an oxide film (see FIG. 2a).

FIG. 2b is a diagram illustrating a B–B' cross section of FIG. 1b. A metal line contact hole 19 is formed by etching the interlayer insulating film 17 using a metal line contact mask as an etching mask. Here, a region "C" shown in FIG. 1b represents a region wherein the metal line contact hole 19 is formed by etching the interlayer insulating film 17 while a region "D" represents a region wherein the metal line contact hole 19 is not formed.

After depositing a predetermined thickness of an oxide film on top surface of the resultant structure, an oxide film spacers 21 are formed along the sidewalls of the metal line contact hole 19 and bit lines 13 are formed by blanket etching the deposited oxide film. Here, the thickness of the mask insulating films 15 on the bit lines 13 formed in the metal line contact hole 19 decreases to t2 due to etching processes to form the metal line contact hole 19 and to form the oxide film spacer 21 (see FIG. 2b).

Next, a metal layer 23 is stacked on top surface of the resultant structure. Here, the metal layer 23 has step coverage of t3 in the metal line contact hole 19 and of t4 from the mask insulating film 15 (see FIG. 2c).

As shown in FIG. 2d, a metal line contact plug 25 is formed by removing portions of the metal layer 23, the interlayer insulating film 17 and the predetermined thickness of the mask insulating film 15 using a CMP process. Here, in order that the metal line contact plug 25 is separated into P1 and P2 using the CMP process, a depth of t4 should be polished using a slurry to remove portions of the metal layer 23.

A polishing speed should be similar between films to remove the above multilayered films. However, a polishing speed of metal layers is over 20 times faster than that of oxide films when a CMP process is performed using conventional CMP slurry for metal to remove a metal. As a result, since a metal layer of a low step coverage is not removed easily due to slow polishing speeds of oxide films or nitride films, a metal line contact plug is not separated (see FIG. 2d), and an equipment vibration phenomenon is generated, resulting in deteriorating stability of the process.

SUMMARY OF THE DISCLOSURE

Accordingly, a method for manufacturing a metal line contact plug of a semiconductor device is disclosed which comprises performing a two step CMP process in which a metal line contact plug is easily separated and a polishing speed of peripheral circuit regions is decreased, thereby improving stability of the process.

BRIEF DESCRIPTION OF THE DRAWINGS

The disclosed methods for manufacturing metal line contact plugs of semiconductor devices will become better understood with reference to the accompanying drawings which are provided by way of illustration only and thus are not limitative of this disclosure, wherein.

DETAILED DESCRIPTION OF THE PREFERRED EMBODIMENTS

A disclosed method for manufacturing a metal line contact plug of a semiconductor device by a CMP process comprises (a) performing a first CMP process using a first slurry solution, the first slurry solution comprising 1 to 20 wt % of abrasive, 0.1 to 15 wt % of oxidizer and 0.01 to 10 wt % of complexing agent based on the total weight of the first slurry solution respectively, and having an etching selectivity of more than 10 for a metal/insulating film and a pH ranging from 2 to 9; and (b) performing a second CMP process using a second slurry solution, the second slurry solution comprising 5 to 30 wt % of abrasive and 0.01 to 5 wt % of oxidizer based on the total weight of the second slurry solution respectively, and having an etching selectivity of less than 3 in the metal/insulating film and a pH ranging from 6 to 12 to easily separate a metal contact plug.

In detail, a disclosed method for manufacturing a metal line contact plug of a semiconductor device comprises:

forming a stack pattern of a bit line and a mask insulating film on a semiconductor substrate;

forming an interlayer insulating film on the entire surface of the resultant structure;

forming a metal line contact hole by defining the metal line contact hole region and selectively etching the interlayer insulating film to expose the semiconductor substrate and the stack patterns present in the contact hole region;

forming oxide film spacers on sidewalls of the metal line contact hole and stack patterns in the metal line contact hole;

depositing a metal layer in the metal line contact hole and on remaining portions of the interlayer insulating film; and performing a two step of CMP process onto the entire surface of the resultant structure until exposing the mask insulating film of the stack pattern to form a metal line contact plug contact to the semiconductor substrate, wherein the CMP process comprises: (a) performing a first CMP process using a first slurry solution having an etching selectivity of more than 10 for metal/insulating film and a pH ranging from 2 to 9; and (b) performing a second CMP process using a second slurry solution having an etching selectivity of less than 3 for metal/insulating film and a pH ranging from 6 to 12, wherein the first slurry solution comprises 1 to 20 wt % of abrasive, 0.1 to 15 wt % of oxidizer and 0.001 to 10 wt % of complexing agent based on the total weight of the first slurry solution, and wherein the second slurry solution comprises 5 to 30 wt % of abrasive and 0.01 to 5 wt % of oxidizer based on the total weight of the second slurry solution.

Here, the insulating film is an oxide or a nitride film.

Methods for manufacturing a metal line contact plug of a semiconductor device in accordance with preferred embodiments will be described in detail with reference to the accompanying drawings.

FIGS. 3a through 3e illustrate methods for manufacturing a metal line contact plug of semiconductor devices.

Figure 1A:
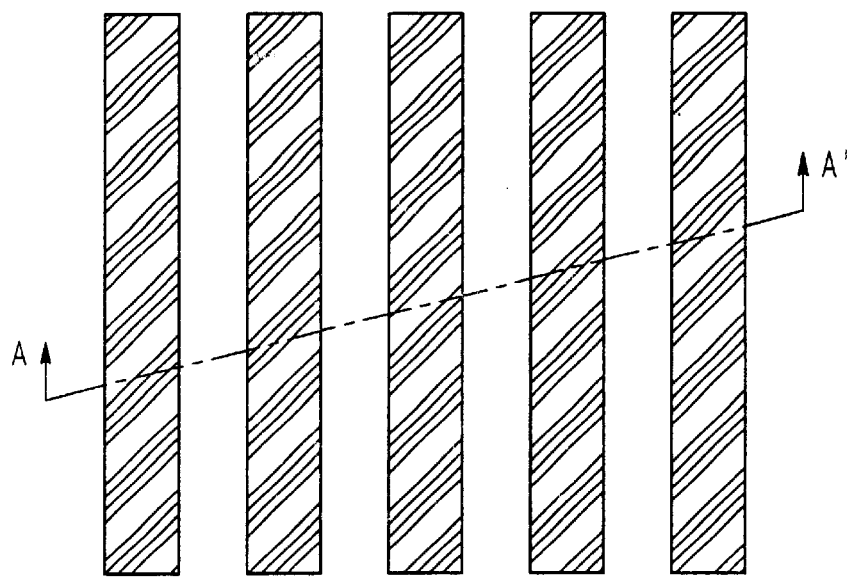
FIG. 1a is a top plan view after formation of a bit line pattern.
Figure 3A:
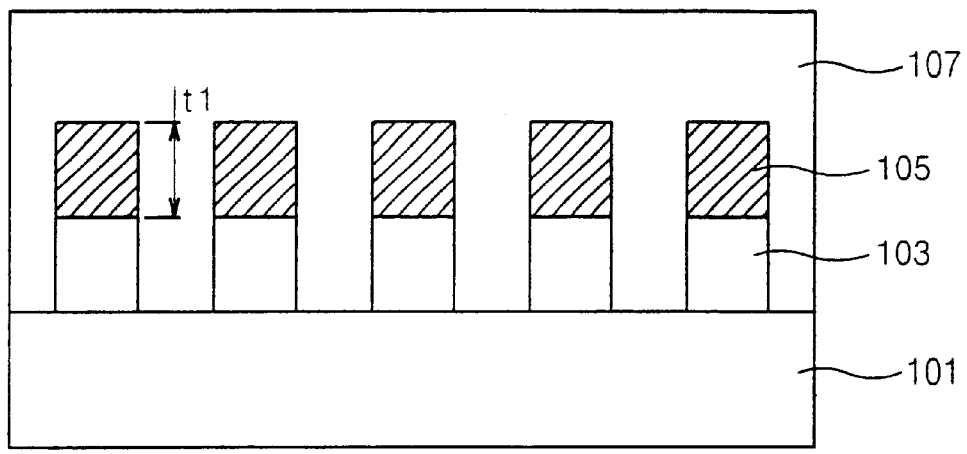
FIGS. 3a through 3e illustrate, schematically, disclosed methods for manufacturing metal line contact plugs of semiconductor devices in accordance with this disclosure.

FIG. 3a is a diagram illustrating a condition wherein an interlayer insulating film is stacked on an A–A' cross section of FIG. 1a. Bit lines 103 whereon mask insulating patterns 105 are stacked are formed on a semiconductor substrate 101. Here, the bit lines 103 are formed of tungsten, and Ti/TiN films as a diffusion barrier film disposed on the lower portion of the bit lines 103 (not shown). The Ti/TiN films are formed by a chemical vapor deposition method using $TiCl_4$ as a source.

The mask insulating films 105 are formed of a nitride film at a temperature ranging from about 500 to about 600° C. by a plasma chemical deposition method, and its thickness is indicated as t1.

Next, an interlayer insulating film 107 is formed on top surface of the resultant structure. Here, the interlayer insulating film 107 is formed of an oxide film (see FIG. 3a).

Figure 1B:
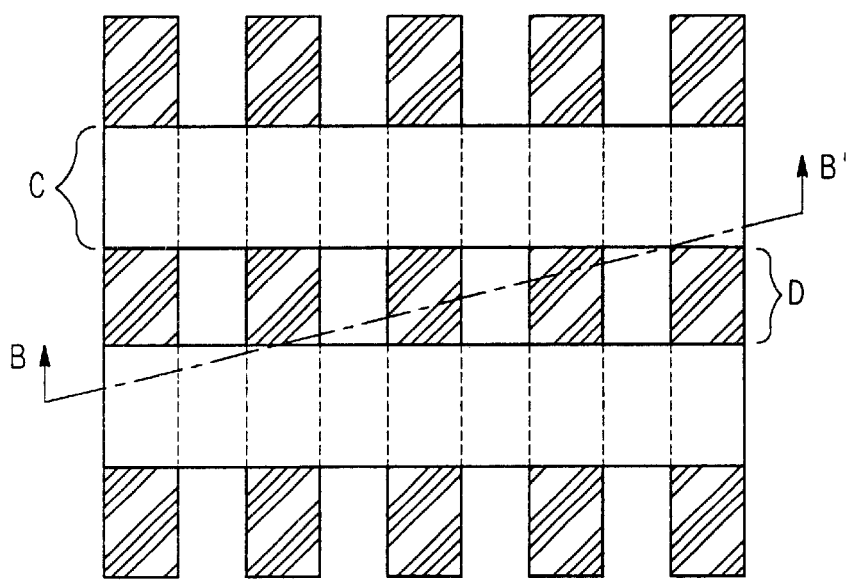
FIG. 1b is a top plan view after etching of a metal line contact plug.
Figure 2A:
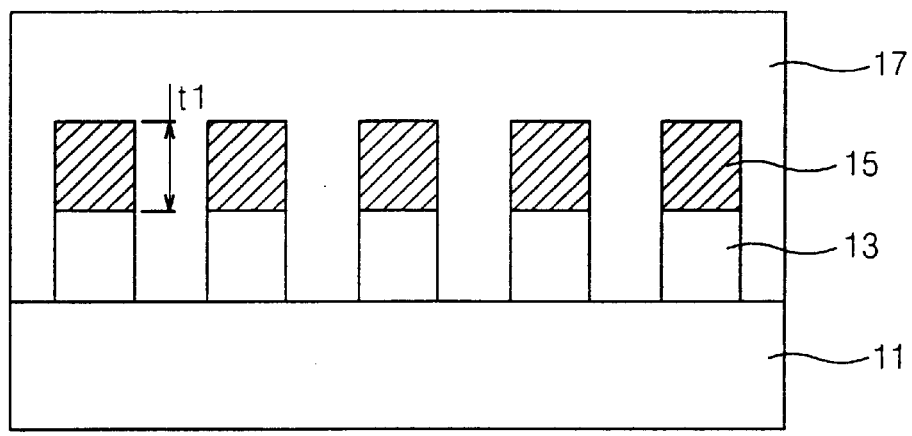
FIGS. 2a through 2d illustrate, schematically, conventional methods of manufacturing metal line contact plugs of semiconductor devices.
Figure 2B:
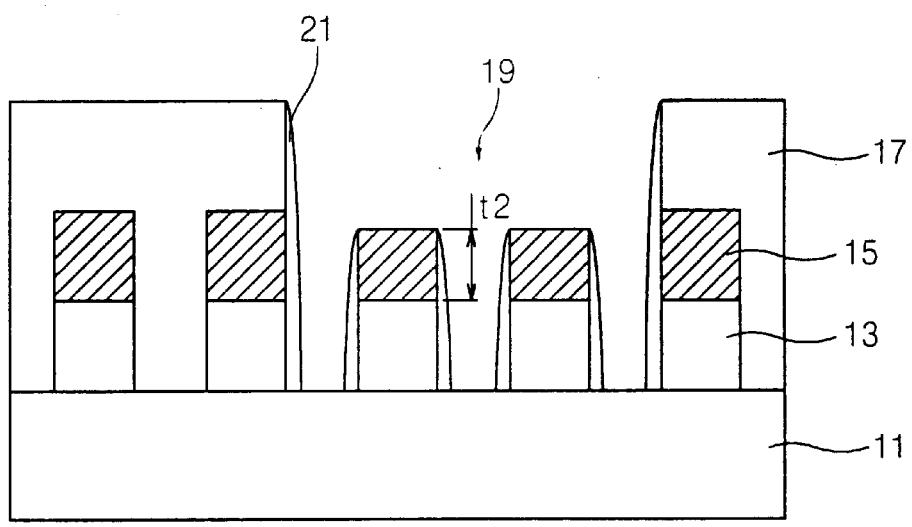
Figure 2C:
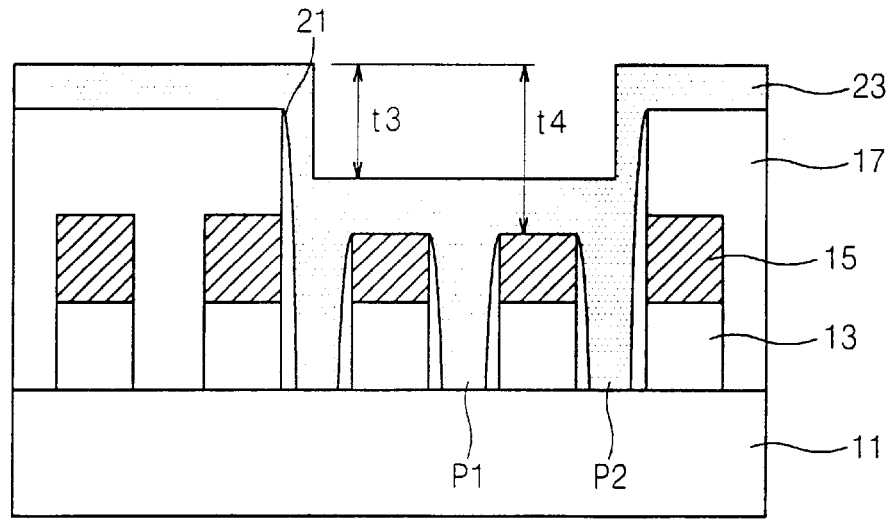
Figure 2D:
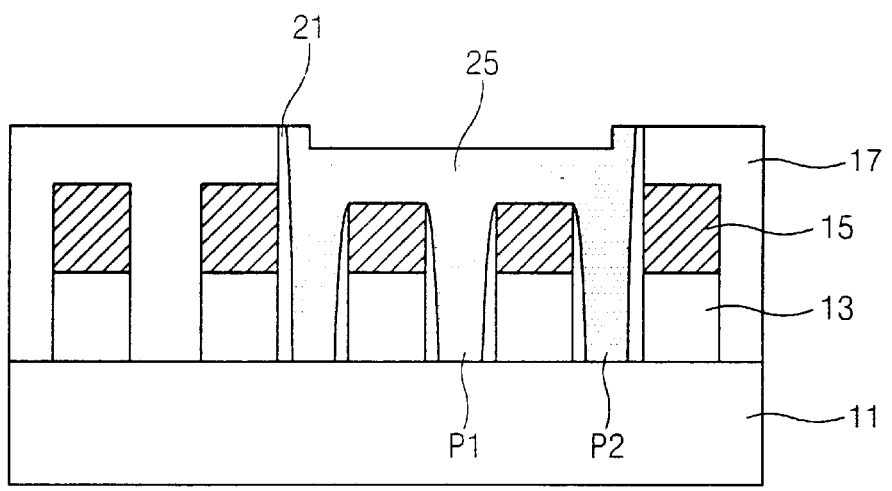
Figure 3B:
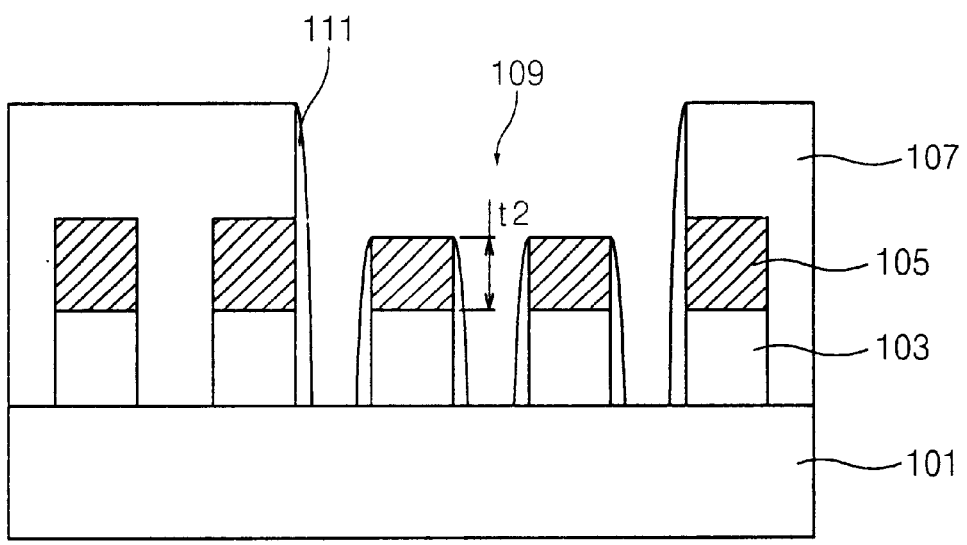

FIG. 3b is a B–B' cross section of FIG. 1b. A metal line contact hole 109 is formed by etching the interlayer insulating film 107 using a metal line contact mask as an etching mask.

Next, an oxide film spacer 111 is formed at sidewalls of the metal line contact hole 109 and the bit lines 103 by depositing a predetermined thickness of oxide film on top surface and then blanket etching it. Here, the thickness of the mask insulating film 105 on the bit line 103 formed in the metal line contact hole 109 decreases to t2 due to the etching processes to form the metal line contact hole 109 and to form the oxide film spacer 111 (see FIG. 3b).

Figure 3C:
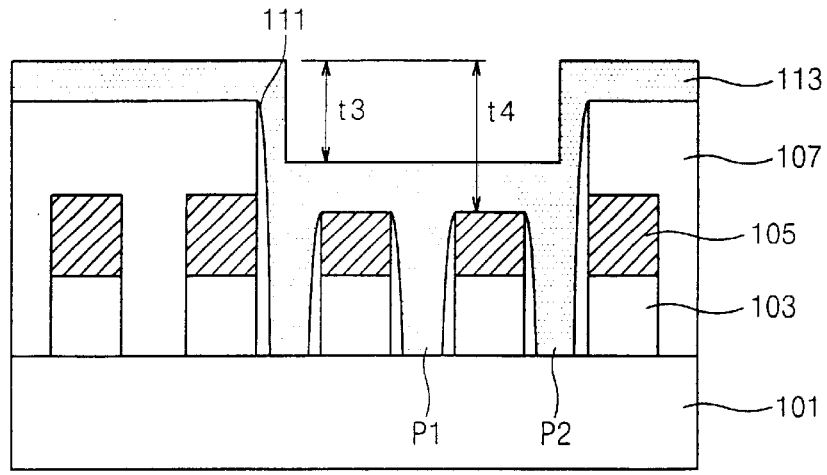

As shown in FIG. 3c, a metal layer 113 is then deposited on top surface. Here, the metal layer 113 consisting of TiN is deposited using an atomic layer deposition method has step coverage of t3 in the metal line contact hole 109 and of t4 from the mask insulating pattern 105.

Thereafter, a first CMP process is performed on the metal layer 113, the interlayer insulating film 107 and the predetermined thickness of the mask insulating film 105, using (1) a first slurry solution having etching selectivity of more than 10 for metal/insulating film and a pH ranging from 2 to 9. Then, a second CMP process is performed on the metal layer 113, the interlayer insulating film 107 and the predetermined thickness of the mask insulating film 105, using (2) a second slurry solution having etching selectivity of less than 3 for metal/insulating film and a pH ranging from 6 to 12.

The first slurry solution comprises an abrasive in an amount ranging from 1 to 20 wt % of the slurry, an oxidizer in an amount ranging from 0.1 to 15 wt % of the slurry and a complexing agent in an amount ranging from 0.01 to 10 wt % of the slurry, and the second slurry solution comprises an abrasive in an amount ranging from 5 to 30 wt % of the slurry and an oxidizer in an amount ranging from 0.01 to 5 wt % of the slurry.

The first slurry solution preferably comprises $SiO_2$, $Al_2O_3$, $MnO_2$ or mixtures thereof as the abrasive, $H_2O_2$, $H_5IO_6$, $FeNO_3$ or mixtures thereof as the oxidizer and citric acid, tartaric acid, succinic acid, malic acid, maleic acid, fumaric acid, malonic acid, EDTA(ethylene diamine tetra acetate), glycolic acid, salts thereof or mixtures thereof as the complexing agent.

The first slurry solution preferably comprises the abrasive in an amount ranging from 5 to 10 wt % of the slurry, the oxidizer in an amount ranging from 5 to 10 wt % of the slurry and the complexing agent in an amount ranging from 0.1 to 1 wt % of the slurry.

It is preferable that the pH of the first slurry solution ranges from 4 to 7.

The second slurry solution preferably comprises $SiO_2$, $Al_2O_3$, $MnO_2$ or mixtures thereof as the abrasive and $H_2O_2$, $H_5IO_6$, $FeNO_3$ or mixtures thereof as the oxidizer.

The second slurry solution preferably comprises the abrasive in an amount ranging from 10 to 25 wt % of the slurry and the oxidizer in an amount ranging from 0.1 to 3 wt % of the slurry.

It is preferable that the pH of the second slurry solution ranges from 8 to 10 and the second slurry solution further comprises KOH, $NH_4OH$, $Na_2CO_3$ or mixtures thereof as pH control agent.

Also, it is preferable that the abrasive of the first and the second slurries has the size ranging from 50 to 300 nm.

Figure 3D:
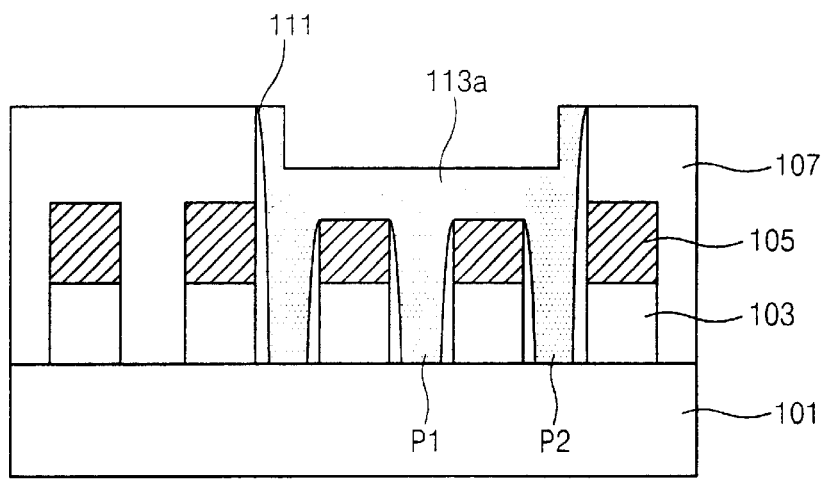
Figure 3E:
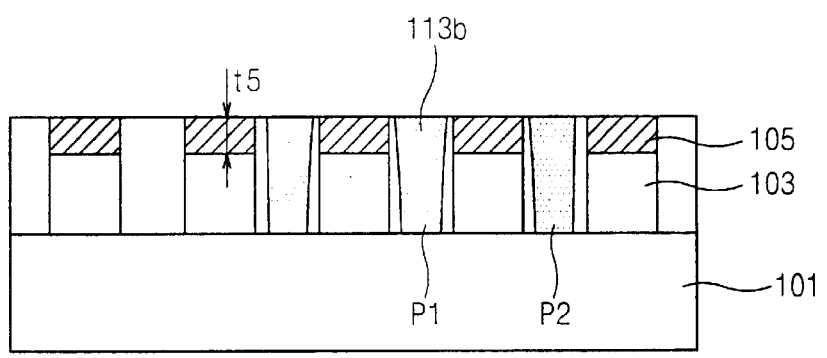

A metal line contact plug 113a wherein the metal layer 113 is more polished than the interlayer insulating film 107 and the mask insulating film 105 is formed via the first CMP process (see FIG. 3d). Then, a metal line contact plug 113b wherein a region P1 and a region P2 are completely separated is formed via the second CMP process (see FIG. 3e).

The interlayer insulating film 107 and the metal layer 113 are polished at a thickness of more than t3 (FIG. 3c) via the first CMP process. Then, the mask insulating film 105, the interlayer insulating film 107 and the metal layer 113 are polished at a thickness of more than t4 via the second CMP process. As a result, the thickness of the mask insulating film 105 above the bit line 103 decreases to t5 (FIG. 3c) smaller than t2 (FIG. 3b).

Accordingly, the CMP process is performed in two steps to remove a top portion of metal layer and then separate a metal line contact plug, thereby preventing a phenomenon that a metal line contact plug is not separated well because a metal layer having a portion with a low step coverage is not removed.

As discussed earlier, a metal line contact plug is manufactured by performing a two step CMP process using (1) a first slurry solution having high etching selectivity of metal/insulating film and (2) a second slurry solution having low etching selectivity of metal/insulating. Here, it is possible to prevent a phenomenon that a metal line contact plug is not separated well because a metal layer having a portion with a low step coverage is not removed. As a result, the disclosed stabilized CMP process can minimize dependency on CMP equipment and ultimately improve operation characteristics and reliability of the resultant semiconductor devices.

What is claimed is:

1. A method for manufacturing a metal line contact plug of a semiconductor device by a Chemical Mechanical Polishing (CMP) process, the method comprising:
    (a) performing a first CMP process using a first slurry solution, the first slurry solution comprising 1 to 20 wt % of abrasive, 0.1 to 15 wt % of oxidizer and 0.01 to 10 wt % of complexing agent based on the total weight of the first slurry solution respectively, and having an etching selectivity of more than 10 for a metal/insulating film and a pH ranging from 2 to 9; and
    (b) performing a second CMP process using a second slurry solution, the second slurry solution comprising 5 to 30 wt % of abrasive and 0.01 to 5 wt % of oxidizer based on the total weight of the second slurry solution respectively, and having an etching selectivity of less than 3 in the metal/insulating film and a pH ranging from 6 to 12.

2. The method according to claim 1, wherein the insulating film is an oxide film or a nitride film.

3. The method according to claim 1, wherein the abrasive of the first slurry solution is selected from the group consisting of $SiO_2$, $Al_2O_3$, $MnO_2$ and mixtures thereof.

4. The method according to claim 1, wherein the oxidizer of the first slurry solution is selected from the group consisting of $H_2O_2$, $H_5IO_6$, $FeNO_3$ and mixtures thereof.

5. The method according to claim 1, wherein the complexing agent of the first slurry solution is selected from the group consisting of citric acid, tartaric acid, succinic acid, malic acid, maleic acid, fumaric acid, malonic acid, EDTA (ethylene diamine tetra acetate), glycolic acid, salts thereof and mixtures thereof.

6. The method according to claim 1, wherein the abrasive of the first slurry solution is present in an amount ranging from 5 to 10 wt % of the first slurry solution.

7. The method according to claim 1, wherein the oxidizer of the first slurry solution is present in an amount ranging from 5 to 10 wt % of the first slurry solution.

8. The method according to claim 1, wherein the complexing agent of the first slurry solution is present in an amount ranging from 0.1 to 1 wt % of the first slurry solution.

9. The method according to claim 1, wherein pH of the first slurry solution ranges from 4 to 7.

10. The method according to claim 1, wherein the abrasive of the second slurry solution is selected from the group consisting of $SiO_2$, $Al_2O_3$, $MnO_2$ and mixtures thereof.

11. The method according to claim 1, wherein the oxidizer of the second slurry solution is selected from the group consisting of $H_2O_2$, $H_5IO_6$, $FeNO_3$ and mixtures thereof.

12. The method according to claim 1, wherein the abrasive of the second slurry solution is present in an amount ranging from 10 to 25 wt % of the second slurry solution.

13. The method according to claim 1, wherein the oxidizer of the second slurry solution is present in an amount ranging from 0.1 to 3 wt % of the second slurry solution.

14. The method according to claim 1, wherein pH of the second slurry solution ranges from 8 to 10.

15. The method according to claim 14, wherein the second slurry solution further comprises a compound as a pH control agent selected from the group consisting of KOH, $NH_4OH$, $Na_2CO_3$ and mixtures thereof.

16. The method according to claim 1, wherein the abrasive of each first and the second slurry solutions has the size ranging from 50 to 300 nm.

17. A method for manufacturing a metal line contact plug of a semiconductor device, the method comprising:
    forming a stack pattern of a bit line and a mask insulating film on a semiconductor substrate;
    forming an interlayer insulating film on the entire surface of the resultant structure;
    forming a metal line contact hole by defining the metal line contact hole region and selectively etching the interlayer insulating film to expose the semiconductor substrate and the stack patterns present in the contact hole region;
    forming oxide film spacers on sidewalls of the metal line contact hole and stack patterns in the metal line contact hole;
    depositing a metal layer in the metal line contact hole and on remaining portions of the interlayer insulating film; and
    performing a two step of CMP process onto the entire surface of the resultant structure until exposing the mask insulating film of the stack pattern to form a metal line contact plug contact to the semiconductor substrate, wherein the CMP process comprises:
        (a) performing a first CMP process using a first slurry solution having an etching selectivity of more than 10 for metal/insulating film and a pH ranging from 2 to 9; and
        (b) performing a second CMP process using a second slurry solution having an etching selectivity of less than 3 for metal/insulating film and a pH ranging from 6 to 12,
    wherein the first slurry solution comprises 1 to 20 wt % of abrasive, 0.1 to 15 wt % of oxidizer and 0.001 to 10 wt % of complexing agent based on the total weight of the first slurry solution, and
    wherein the second slurry solution comprises 5 to 30 wt % of abrasive and 0.01 to 5 wt % of oxidizer based on the total weight of the second slurry solution.

18. The method according to claim 17, wherein the mask insulating film is a nitride film.

19. The method according to claim 17, wherein the interlayer insulating film is an oxide film.

20. The method according to claim 17, wherein the metal layer is a TiN film formed by atomic layer deposition.

* * * * *

UNITED STATES PATENT AND TRADEMARK OFFICE
CERTIFICATE OF CORRECTION

PATENT NO. : 6,864,177 B2
DATED : March 8, 2005
INVENTOR(S) : Jong G. Jung et al.

It is certified that error appears in the above-identified patent and that said Letters Patent is hereby corrected as shown below:

Title page,
Item [75], Inventors, after "Jong Goo Jung" please delete "Kyoungk-do" and insert -- Kyoungki-do -- in its place; and after "Ki Cheol Ahn" please delete "Kyoungk-do" and insert -- Kyoungki-do -- in its place.

Signed and Sealed this

Second Day of August, 2005

JON W. DUDAS
*Director of the United States Patent and Trademark Office*